(12) United States Patent
Martinsen

(10) Patent No.: US 6,636,539 B2
(45) Date of Patent: Oct. 21, 2003

(54) METHOD AND APPARATUS FOR CONTROLLING THERMAL VARIATIONS IN AN OPTICAL DEVICE

(75) Inventor: Robert Jens Martinsen, Morgan Hill, CA (US)

(73) Assignee: Novalux, Inc., Sunnyvale, CA (US)

( * ) Notice: Subject to any disclaimer, the term of this patent is extended or adjusted under 35 U.S.C. 154(b) by 0 days.

(21) Appl. No.: 09/866,062

(22) Filed: May 25, 2001

(65) Prior Publication Data

US 2002/0176459 A1 Nov. 28, 2002

(51) Int. Cl.$^7$ ................................................. H01S 3/04
(52) U.S. Cl. ............................................ 372/36; 372/92
(58) Field of Search ............................. 372/36, 92, 96, 372/50; 257/197, 601, 706; 174/264; 228/121; 438/24

(56) References Cited

U.S. PATENT DOCUMENTS

| | | | |
|---|---|---|---|
| 5,392,982 A | * 2/1995 | Li | 228/121 |
| 5,627,853 A | 5/1997 | Mooradian et al. | 372/92 |
| 5,770,821 A | * 6/1998 | Hikasa et al. | 174/264 |
| 5,837,561 A | * 11/1998 | Kish et al. | 438/24 |
| 5,864,169 A | * 1/1999 | Shimura et al. | 257/197 |
| 5,898,211 A | * 4/1999 | Marshall et al. | 257/601 |
| 6,251,706 B1 | * 6/2001 | Paniccia | 257/706 |

* cited by examiner

Primary Examiner—Paul Ip
Assistant Examiner—Tuan Nguyen
(74) Attorney, Agent, or Firm—Kenyon & Kenyon

(57) ABSTRACT

A method and apparatus are provided for reducing thermal gradients in optical devices. According to an embodiment of the invention, the size of the heat sink interface is adapted to correspond to a region of principal heat generation within the device. Doing so can make the heat generating region within the device have a more laterally uniform temperature gradient. The reduction (or elimination) of such temperature gradients can lead to a marked reduction in thermal lensing and greatly diminish the change in lensing with applied current, thereby improving the performance of the optical device over a wide operating range.

21 Claims, 9 Drawing Sheets

METHOD AND APPARATUS FOR CONTROLLING THERMAL VARIATIONS IN AN OPTICAL DEVICE

BACKGROUND OF THE INVENTION

The present invention relates to optical devices such as LASER devices. More particularly, the present invention pertains to a method and apparatus for controlling temperature variations in a laser or other optical device.

Laser (Light Amplification by Stimulated Emission of Radiation) devices are well known in the art. These devices include semiconductor laser devices, which under the right circumstances will emit coherent light in a limited frequency range. An intrinsic part of the device is the optical resonator, including at least two opposing mirrors surrounding a gain medium. VCSELs typically employ distributed Bragg reflectors (DBRs) as the mirrors that bound quantum wells (QWs) that provide the gain. The DBR and QW structures are very thin epitaxial layers grown on a relatively thick substrate of near-lattice-matched semiconductor material.

Laser devices must be "pumped" or excited in some way to achieve the conditions necessary for stimulated emission to occur. One method for pumping a semiconductor laser is to inject current through the device. Electrical contacts on the substrate and the DBR are designed to facilitate current flow through that region of the gain medium that subtends the optical aperture. Since electrical contacts typically do not have good optical transmission properties, a ring contact is often used on the exit aperture-side of the device to minimize optical loss for laser emission. A current field, and thus heating profile, is established between a ring annulus on one side of the device and a concentric plate on the other. This geometric arrangement of electrical interface causes the current to spread away from the optical axis, thereby competing with the ability to axially pump the quantum wells for fundamental transverse mode operation. In general, modal gain is maximized when the lateral current profile in the active region is well overlapped with the spatial mode(s) of the cavity one wishes to excite. Current-confining measures such as ion implantation and selective oxidation are often employed to increase the modal gain, thereby reducing threshold current and improving device efficiency. Several mechanisms are responsible for generating heat in VCSELs. Resistance to the flow of current through the DBR mirrors and substrate causes heating in these regions to be proportional to the square of the current $[P_{heat}=I^2R]$. When current is injected into the quantum wells, electrons and holes recombine and release energy. Two recombination processes are possible: one is a radiative process responsible for the generation of photons, and the other is a nonradiative process resulting in heat. The amount of heat generated in this very thin region is linearly proportional to the injected current and voltage drop across the active layer $[P_{heat}\sim IV]$. Furthermore, the reabsorption of photons—from both stimulated and spontaneous emission processes—can generate additional heating throughout the device.

All of these spatially-dependent heating processes lead the temperature of the laser device to increase rather non-uniformly. Inhomogeneous temperature fields not only lead to undesirable optical characteristics—such as aberrations, self-focusing/defocusing, and speckle—but make overall device performance current-dependent as well. Collectively, thermo-optic effects are responsible for limiting the useful output of many electro-optic devices to a very narrow operating range of current, and in some extreme cases, even a single-point design.

Temperature affects the propagation of light by modifying the refractive index of the medium through which the light travels. In general, light travels faster through a colder medium than a hotter medium due to the positive thermo-optic response, dn/dT (refractive index n increases with an increase in temperature T), characteristic of most optical materials. Therefore, a beam of light that passes through a medium with a lateral temperature gradient would experience a phase delay across the transverse dimension of the beam causing the wavefront to bend. This effect is sometimes referred to as thermal lensing because the temperature gradient works to focus (or defocus for materials with a negative dn/dT response) the light generated in the laser device. Thermal lensing is one of the fundamental considerations to the design of a single-mode laser cavity since the amount of lensing (expressed in terms of its effective focal length or inverse focal length) changes with pump power. As a result, single-mode laser action tends to be restricted to a relatively narrow range of applied current.

One known method for limiting the temperature rise in a laser device is to physically couple it to a heat sink. The maximum temperature rise and thermal resistance for the device scales inversely with the area A and thermal conductivity k of the heat sink. It is common practice in thermal design to maximize both of these variables within the typical constraints of manufacturability, cost, package size, availability of materials, etc. When the same methodology is applied to the heat transfer in VCSELs, radial temperature gradients in the device (relative to the light beam) not only prevail but are exacerbated. As a result, thermal lensing effects can even plague a laser device's ability to exhibit low thermal resistances.

In view of the above, there is a need for an improved method and apparatus to control temperature variations in a laser device.

SUMMARY OF THE INVENTION

In an embodiment of the invention, a heat sink is coupled to a first portion of a surface of a light-emitting device via a heat sink interface, while an insulating region is disposed between a second portion of the surface of the light-emitting device and the heat sink. In another embodiment of the invention, a method is provided for controlling a temperature distribution profile in an optical device. In other embodiments of the invention, a reduced strain optical device, and a method for reducing strain in an optical device are provided.

DETAILED DESCRIPTION

Figure 1:
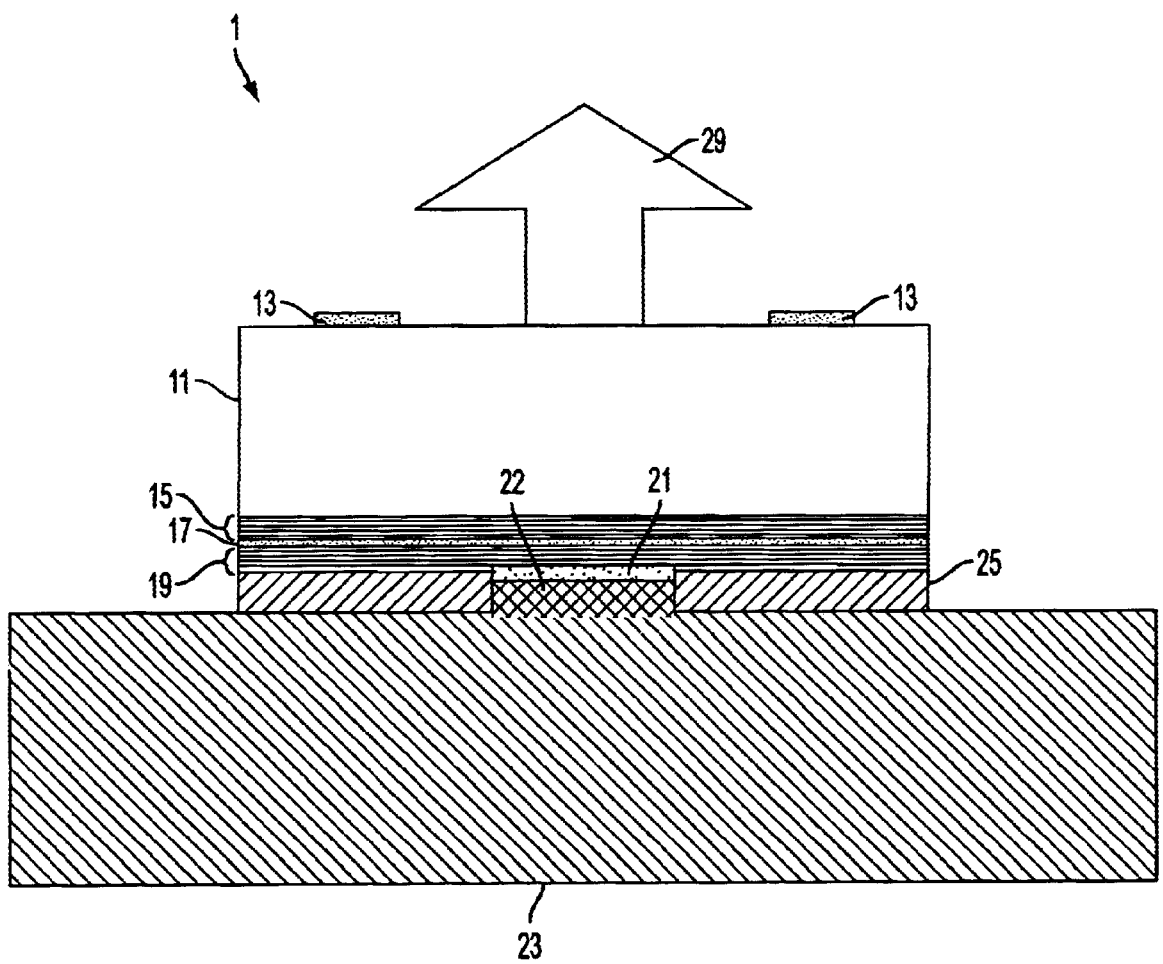
FIG. 1 is a diagram of an optical device constructed according to an embodiment of the present invention.

Referring to FIG. 1, a block diagram of an optical device is shown constructed according to an embodiment of the present invention. In this embodiment, a Vertical Cavity Surface Emitting Laser (VCSEL) device is shown, though the present invention is not limited to solely these devices. In this embodiment, the device is constructed so that light is emitted through the substrate. It will be understood by those skilled in the art that the invention may be equally applied to a device of reversed geometry, i.e., where the contacts are reversed and the light is not emitted through the substrate. In the VCSEL 1 shown in FIG. 1, electrical current is used to "electrically pump" a gain medium 17 (e.g., a quantum well gain region) that causes the production of electrons in the laser device. A first electrical contact 13 is provided on top of the substrate 11. In this embodiment, the electrical contact has a circular, ring-shaped design. Below substrate 11 is a partially-reflective mirror layer 15, a gain medium layer 17 and a substantially fully-reflective mirror layer 19 (e.g., with a reflectivity greater than 99%). The mirror layers may be, for example, distributed Bragg reflectors (DBRs), which are comprised of multiple layers of alternating materials, as well-known in the art. On the opposite side of the fully-reflective mirror layer 19, a second electrical contact 21 is located. For example, the foregoing elements may be made using any of a variety of well-known semiconductor fabrication procedures such as epitaxial deposition. In this example, the second electrical contact 21 has a circular shape.

A heat sink 23 is coupled to the second electrical contact 21 to draw heat away from the VCSEL device 1. In this embodiment, the heat sink 23 is made of aluminum, copper, beryllium oxide, or any of a variety of other suitable materials that have high heat conductivity. Rather than coupling the heat sink to the entire surface area of the VCSEL 1 opposite the optical aperture, as in the prior art, the heat sink is in contact with a partial surface area, roughly corresponding to the area in the device where the majority of heat is generated. In this embodiment of the present invention, the heat sink is in contact solely over the surface area of the electrical contact and an insulting layer separates other portions of the heat sink from the VCSEL device. In particular, a heat sink interface 22 couples the heat sink to the electrical contact. For example, a gold-tin solder may be used for the heat sink interface. In this embodiment, a thermally insulating region or layer 25 is provided between the heat sink and those parts of the optical device that are not in direct thermal contact with the heat sink. The term "insulating layer" or "insulating region," as used in this document, refers to a region of material having a different thermal conductivity from the material thermally coupling the heat sink to the optical device, such as a thermally insulating, semi-insulating, or even a thermally conductive material with a different thermal conductivity. For example, the insulating region may consist of any suitable material that at least partially prevents or reduces the transfer of heat from the substrate to the heat sink, such as silicon nitride ($Si_3N_4$), silicon oxide ($SiO_2$), air, or even a vacuum. In the examples of air or a vacuum, one or more spacers or seals may be needed between the heat sink and the substrate to maintain the vacuum or assist in manufacture and maintain an even spacing (gap) between the two components (see below with respect to FIGS. 8 and 9).

Figure 2:
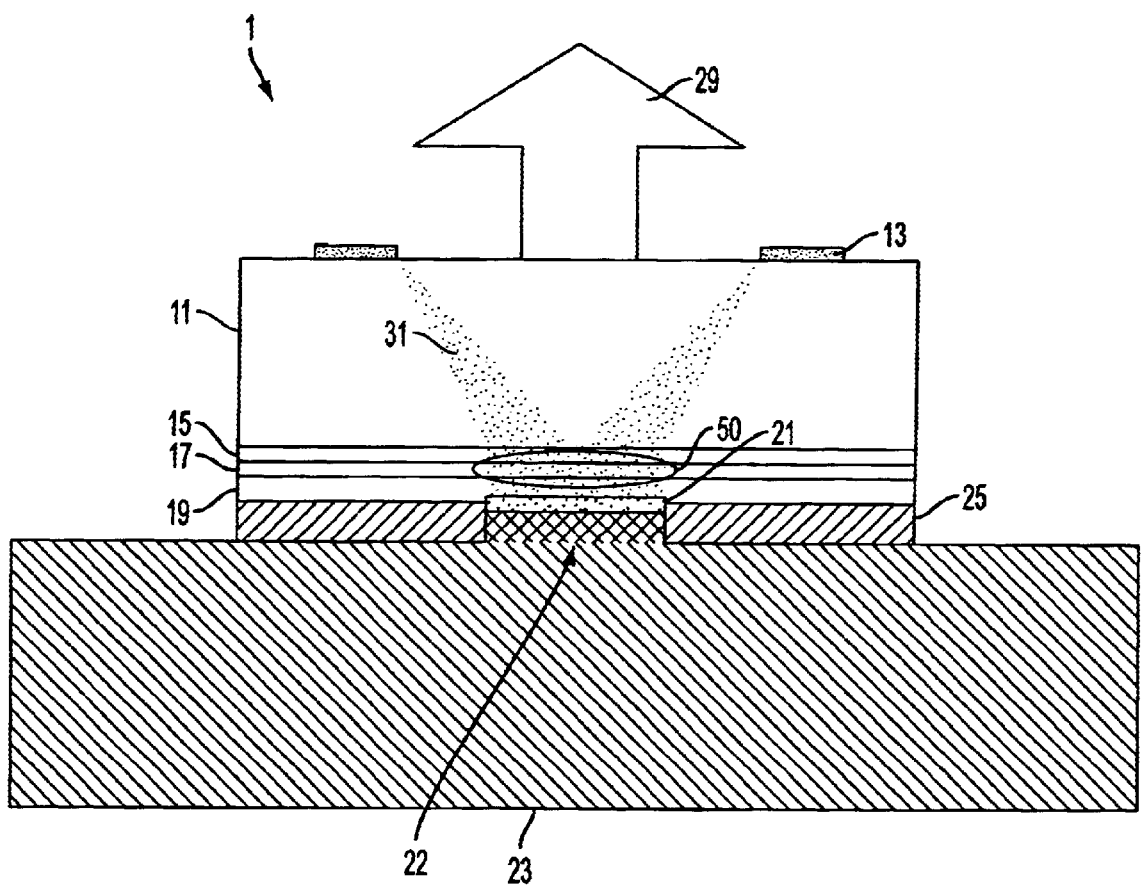
FIG. 2 is a diagram of the optical device of FIG. 1 showing the conduction of current between electrical contacts.

Referring to FIG. 2, the VCSEL of FIG. 1 is shown where current 31 is flowing between electrical contacts 13 and 21. Though an approximation, current tends to travel between an inside edge of the electrical contact 13 and the entire surface are of the electrical contact 21. It is in this volume where most heat is generated in the device. More specifically, in this embodiment, the principal area of heat generation 50 is the area where most of the non-radiative recombination of carriers occurs, i.e., in the gain region 17 and surrounding areas. In an optically-pumped device, for example, the principal area of heat generation is also in the gain region, in the area pumped by the light beam. The heat is created by losses due to the quantum defect (i.e., the pump wavelength is shorter (more energetic) than the output wavelength) as well as optical absorption within the device.

Because the heating in the electrically-pumped device shown in FIG. 2 is due mostly to the injection of the electrical current, and because the electrical contact is relatively close to the gain medium in this embodiment, the area of the heat sink interface 22 corresponds to the area of the electrical contact 21. In other embodiments of the invention, the area of the electrical contact may not correspond to the principal area of heat generation, for example, where the heat sink interface may not correspond directly to the electrical contact area.

Figure 3:
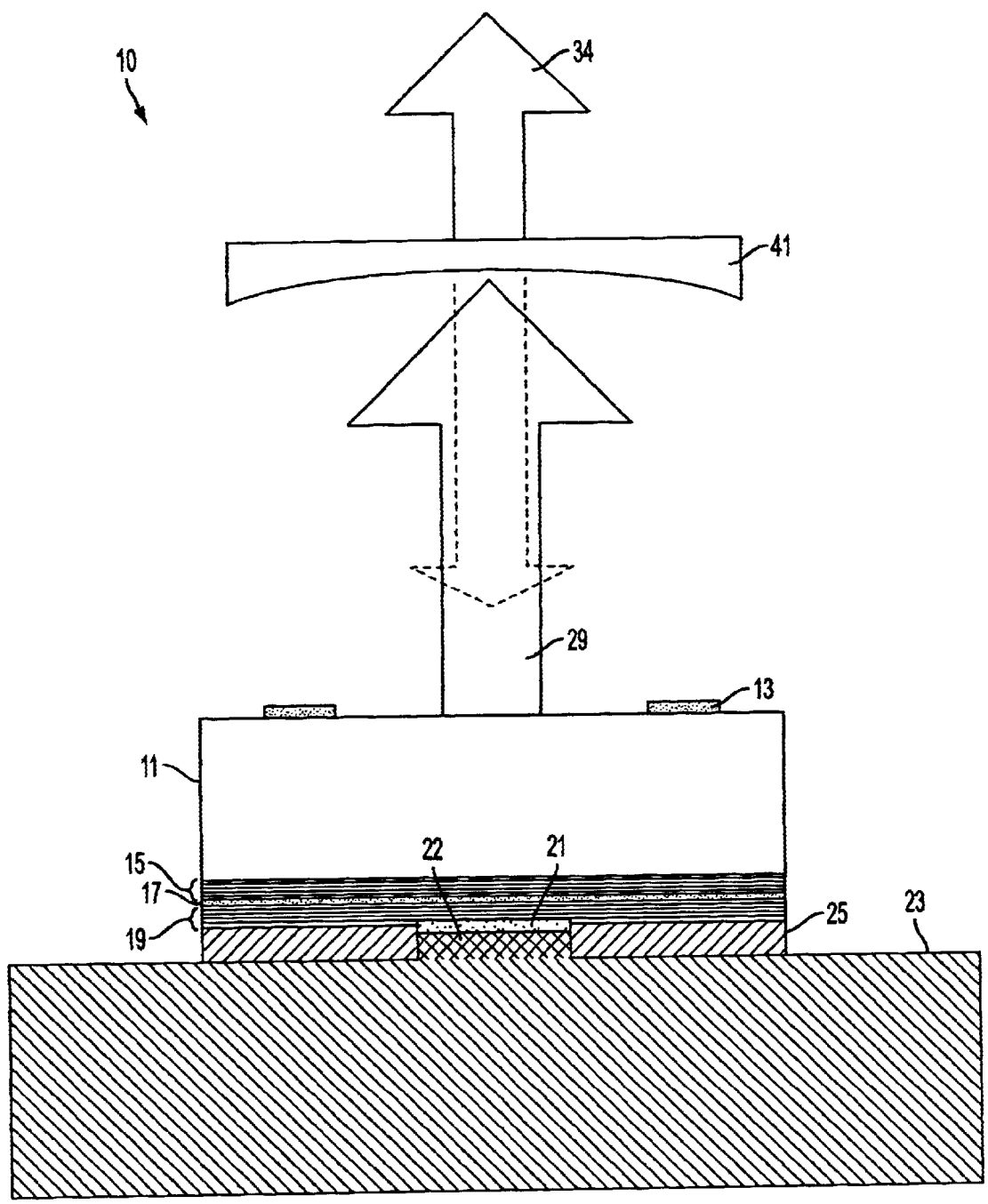
FIG. 3 is a diagram of another optical device according to another embodiment of the invention.

Referring to FIG. 3, an optical device of the type shown in FIG. 1 is shown including an external mirror/lens 41 creating an extended laser resonant cavity. For a vertical extended cavity surface emitting laser ("VECSEL"), an external mirror/lens is displaced from the substrate 11 so as to create an extended laser cavity. During operation, photons generated in the VECSEL 10 may reflect between the partially-reflective mirror 15 and the fully-reflective mirror 19. Those photons that pass through the partially reflective mirror 15 form a light beam 29 traveling through the aperture formed within the contact 13. A portion of this light is reflected back into the device by the external mirror/lens 41, while a portion passes through as an output beam 34. As described above, the negative effect of thermal lensing occurs when a radial variation in temperature exists across the substrate 11. Assuming that the light beam 29 has an axis, thermal lensing would occur if there is a temperature gradient perpendicular to that axis. In such a situation, photons traveling parallel to and distributed radially about this axis will travel at different speeds due to a modification of the refractive index by the radial variation in temperature.

Figure 4:
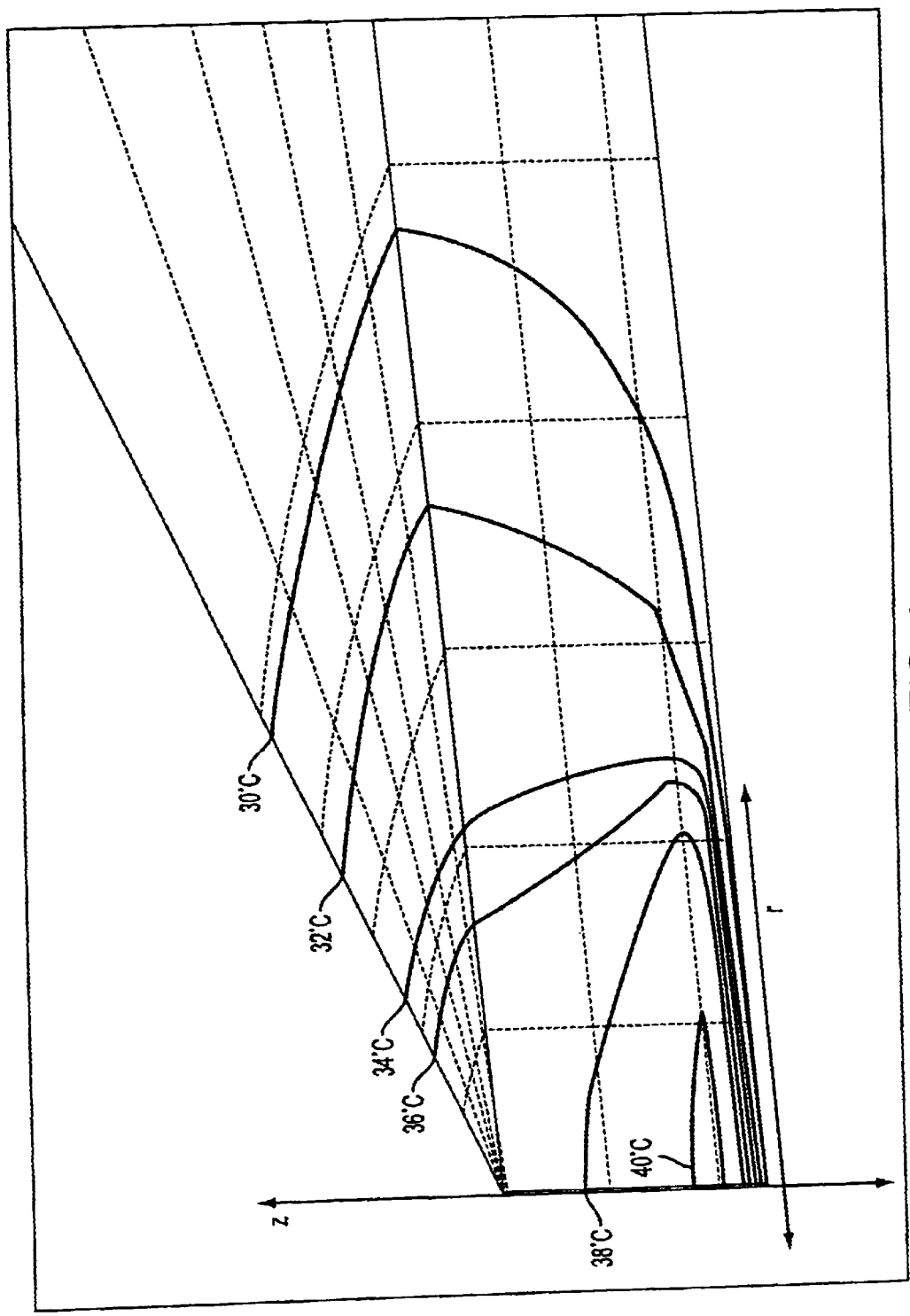
FIG. 4 is a three-dimensional graph showing the change in temperature over volume for an optical device having a thermal gradient in both an axial and radial direction over an electrical contact.

If the heat sink directly contacts the entire bottom surface of the device, a considerable radial variation in temperature will exist. Referring to FIG. 4, a three-dimensional model showing the change in temperature over volume for a VECSEL is shown. In this example, the heat sink contacts the entire bottom surface of the substrate and the electrical contact. The graph shows the temperature gradient from the center of the electrical contact 21 (FIG. 1) and extending in the z-direction (i.e., perpendicular to the contact surface) to the bottom surface of the first electrical contact 13 (FIG. 1). It can be readily seen that there is not uniformity in temperature distribution in either the z direction, over the entire thickness of the device, or in the radial direction (r) in the plane perpendicular to the optical axis. It is the temperature gradient in the r direction that is mostly responsible for the thermal lensing effect.

Figure 5:
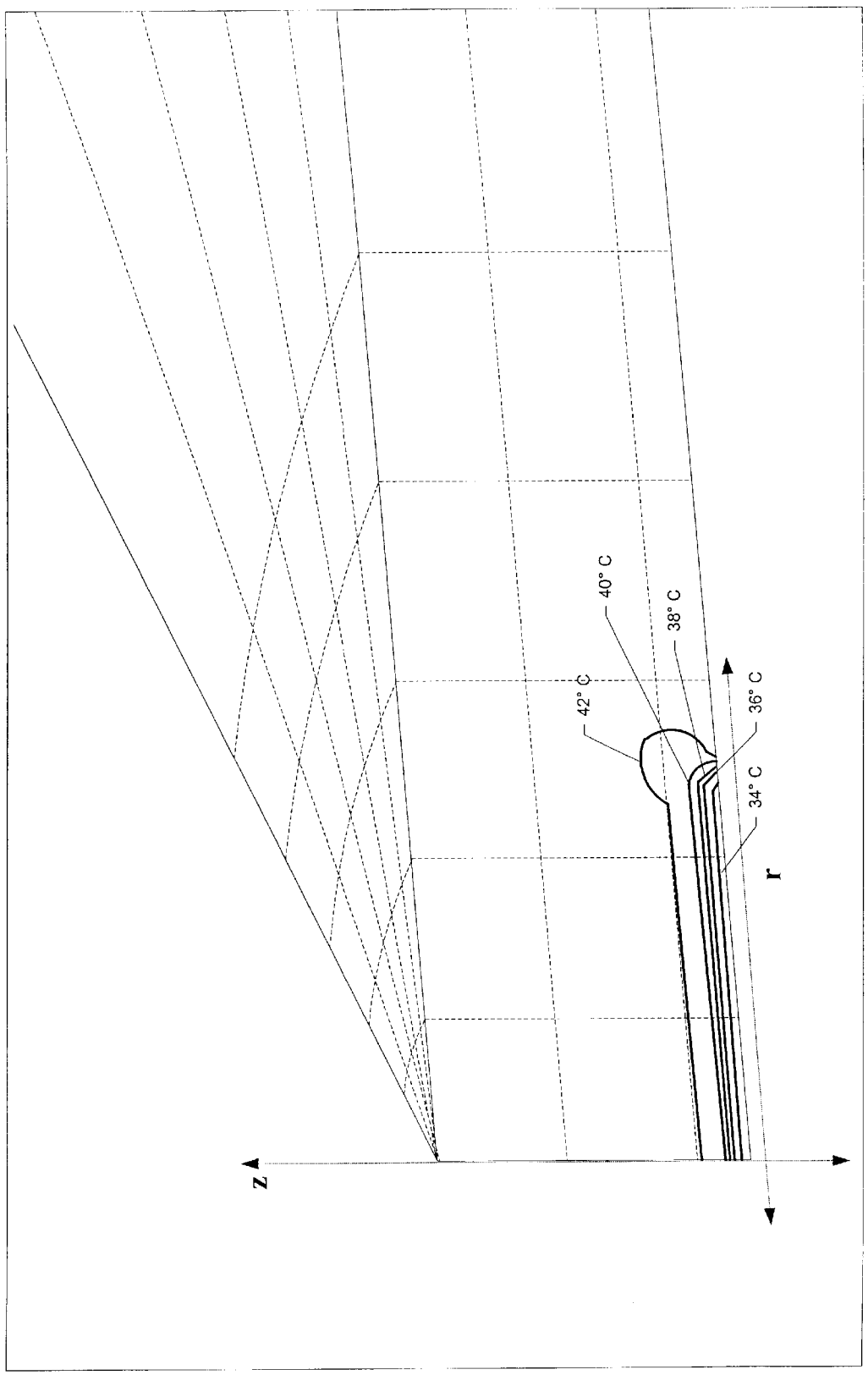
FIG. 5 is a three-dimensional graph showing the change in temperature over volume for an optical device constructed according to an embodiment of the present invention.

Referring to FIG. 5, a three-dimensional model showing the change in temperature over volume for the VECSEL of FIG. 3 is presented. In this example the thermal interface between the heat sink and the lower surface of the laser device is designed to limit the radial variation in temperature across the optical aperture of the device. In this case, most of the heat is generated directly above the electrical contact, so the interface is limited to the surface of the electrical contact, and the insulating region is comprised of air. In FIG. 3, the interface 55 has a circular shape and a diameter, $D_i$, that is equal to the diameter, $D_e$, of the circular electrical contact 21 in this embodiment. As can be seen from the model of FIG. 5, there is substantial uniformity in the radial temperature distribution throughout much of the device. In this example, $D_i$ was chosen such that the radial variation in temperature "seen" by the spatial mode of the cavity is all but eliminated, thereby rendering the thermal lens substantially nonexistent.

Figure 6:
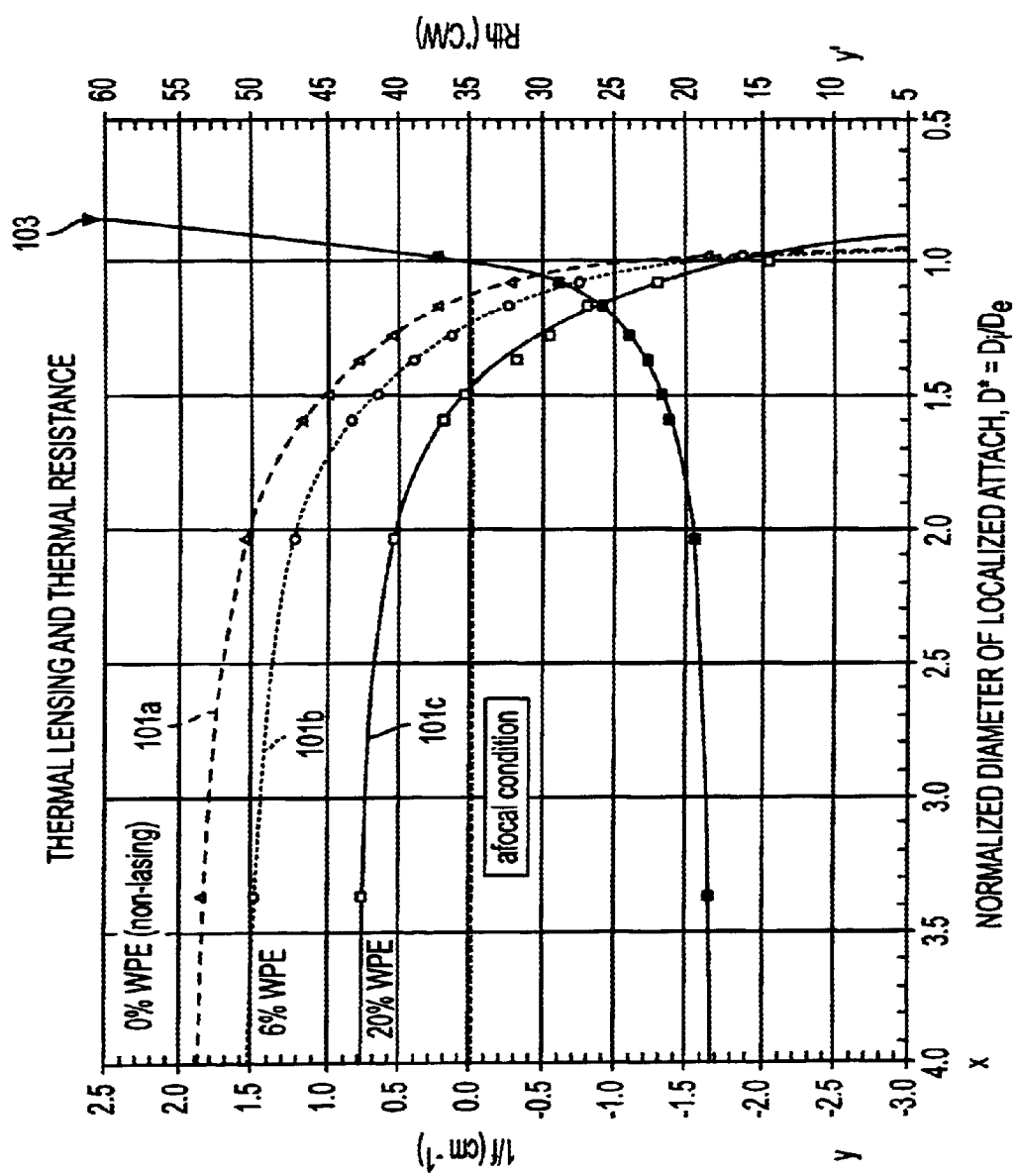
FIG. 6 is a graph showing a correlation between a thermal lensing effect and the size of an interface between an electrical contact and a heat sink.

In the foregoing examples, the electrical contact has a circular shape and the interface between the heat sink and the electrical contact also has a circular shape. In these examples, the diameter of the heat sink interface and the electrical contact are equal. Referring to FIG. 6, a graph showing the effect of the diameter of the heat sink interface is presented. The x axis refers to the dimensionless ratio $D^*=D_i/D_e$ between the diameter of the heat sink interface $D_i$ and the diameter of the current aperture $D_e$. The "current aperture" refers to the area of the limiting aperture through which current is injected into the device. This could be referenced with respect to the electrical contact and any current confining techniques employed in a device such as a selective oxide or proton implant region. In the present embodiment, the area of the electrical contact corresponds to the area of the current aperture, and is a good approximation of the area where the majority of the heat is generated within the optical aperture of the device. The left-side y-axis in FIG. 6 corresponds to lines 101a–c and measures the inverse of the focal length (in centimeters) of the thermal lens. The right-side y-axis (shown as y') corresponds to line 103 and measures the thermal resistance ($R_{th}$) in degrees Celsius per Watt of input power deposited as heat in the device. It is desirable, particularly for reliability considerations, to keep thermal resistance as low as possible. As seen from the graph, the elimination of thermal lensing for this device occurs at a ratio $D^*=1.5$. At this ratio, the thermal resistance increases from 18° C./W (for a conventional die attach in which $D^*$ is much greater than 1.5) to 22° C./W. In other words, thermal lensing may be eradicated at the expense of increasing overall thermal resistance by approximately 20%. FIG. 6 indicates that a reduction in thermal lensing can be realized when $D^*$ ratios less than 3 are implemented.

At the other end of the spectrum, thermal lensing is reduced when the ratio $D^*$ is greater than 1. It can be seen that a very low thermal lensing effect (i.e., less than approximately 0.5 cm$^{-1}$ inverse focal length in magnitude) is seen in this example where the ratio is between approximately 1.25 and approximately 2.00 and the optimal point is when the ratio is at 1.5 for this device. A minimal impact in thermal resistance may be maintained in this range, as well. In FIG. 6 the parameter WPE refers to the wall plug efficiency and is measured in this embodiment as the optical output power divided by the electrical input power In FIG. 6, values for the wall plug efficiency (WPE) are 20% (101a), 6% (101b), and 0% (101c) (i.e., at 0% the cavity is blocked to prevent the device from lasing). The graph of FIG. 6 applies to a VECSEL device having a circular electrical contact with a diameter of 150 microns. As parameters for the area of the electrical contact, the wall plug efficiency, the thickness and type of insulating material, etc. change, the plots for 101a–c and 103 will change as well. Thus, as the parameters of the optical device are changed, the internal temperature profile of the device will change and the geometry and materials of the heat sink interface and the insulating region will be modified to adjust the thermal profile accordingly. In this embodiment, the ratio of the diameters of the current aperture and the heat sink interface is selected so as to control the resulting thermal lensing effect for the particular device.

In a further embodiment of the present invention the gap width and thermal conductivity of the insulating material are selected to further minimize thermal gradients that lead to thermal lensing effects. According to this embodiment, the maximum temperature rise in the device is measured directly or calculated using simple analytic or more sophisticated numerical heat transfer modeling techniques. The latter may be performed, for example, by specifying material characteristics and device geometries into a standard finite element analysis (FEA) program such as the COSMOS/M program available from Structural Research and Analysis Corporation (Los Angeles, Calif.). Alternatively, if a device's characteristics are well-known, a direct measurement of the thermal lens may be performed by measuring the divergence of a collimated probe beam while the device is injected with current. The temperature gradient within the device may also be inferred from the measured thermal lens focal length.

For the example of substantially eliminating a thermal lens through uniformity of lateral temperature distribution, a method is further explained below. Once the peak temperature rise in the device is determined, the optimal thickness $t_{ins}$ and thermal conductivity $k_{ins}$ of the insulating material between the heat sink and bottom surface of the device outside the $D_i$ interface may be determined. In order to achieve lateral uniformity of temperature distribution, the resulting optimization should create a condition in which the thermal impedance of that interface (for $D>D_i$) leads to a temperature rise directly across that interface which is matched to the peak temperature rise of an equivalent broad-area die attach. It is a subtle yet important aspect of the design to not completely "cut-off" the transfer of heat outside the diameter $D_i$, but allow it to be "sub-adiabatic" to minimize the temperature rise of the localized die attach device. In other words, where the goal is achieving uniform lateral temperature distribution in the device, the thermal conductivity of the material contacting an area of the device is roughly matched to the amount of heat generated in that area. Where the amount of heat generated is high (e.g., around the electric contact), a high thermal conductivity interface is used, and where the heat generated is lower, a lower (but non-zero) thermal conductivity interface may be used because heat must still be removed from this region to achieve uniformity. The optimization of $t_{ins}$ and $k_{ins}$ is unique to every combination of size, shape, and material composition chosen for the heat sink.

The invention methods described above can be followed to influence the temperature gradient in the device to an arbitrary profile that is considered desirable for a given application. For example, this technique can be used to reduce the thermal lens present in a laser device. Alternatively, for some applications it may be desirable to increase the effect of the thermal lens or tailor it to a particular shape (see, e.g., U.S. Pat. No. 5,627,853, which discloses use of a thermal lens in mode control of a laser, where the thermal lens is controlled by controlling the pump power level). In the present invention, by adjusting the shape, size, and thermal conductivities of the heat sink and insulating layer, the thermal lens calculated or determined experimentally, as described above, may be adapted to achieve a desired lensing effect.

In the example of using the method to reduce a thermal lens effect in the device shown in FIG. 3, the diameter of the current aperture and heat sink interface is the same and the gap between the substrate and the heat sink is 6.5 microns. The insulating material in this embodiment is air and the heat sink is beryllium oxide. For heat sink materials with higher thermal conductivity, such as diamond, the thickness of the insulating material (e.g., air in this embodiment) would be smaller to achieve the impedance matching condition described above.

Figure 7:
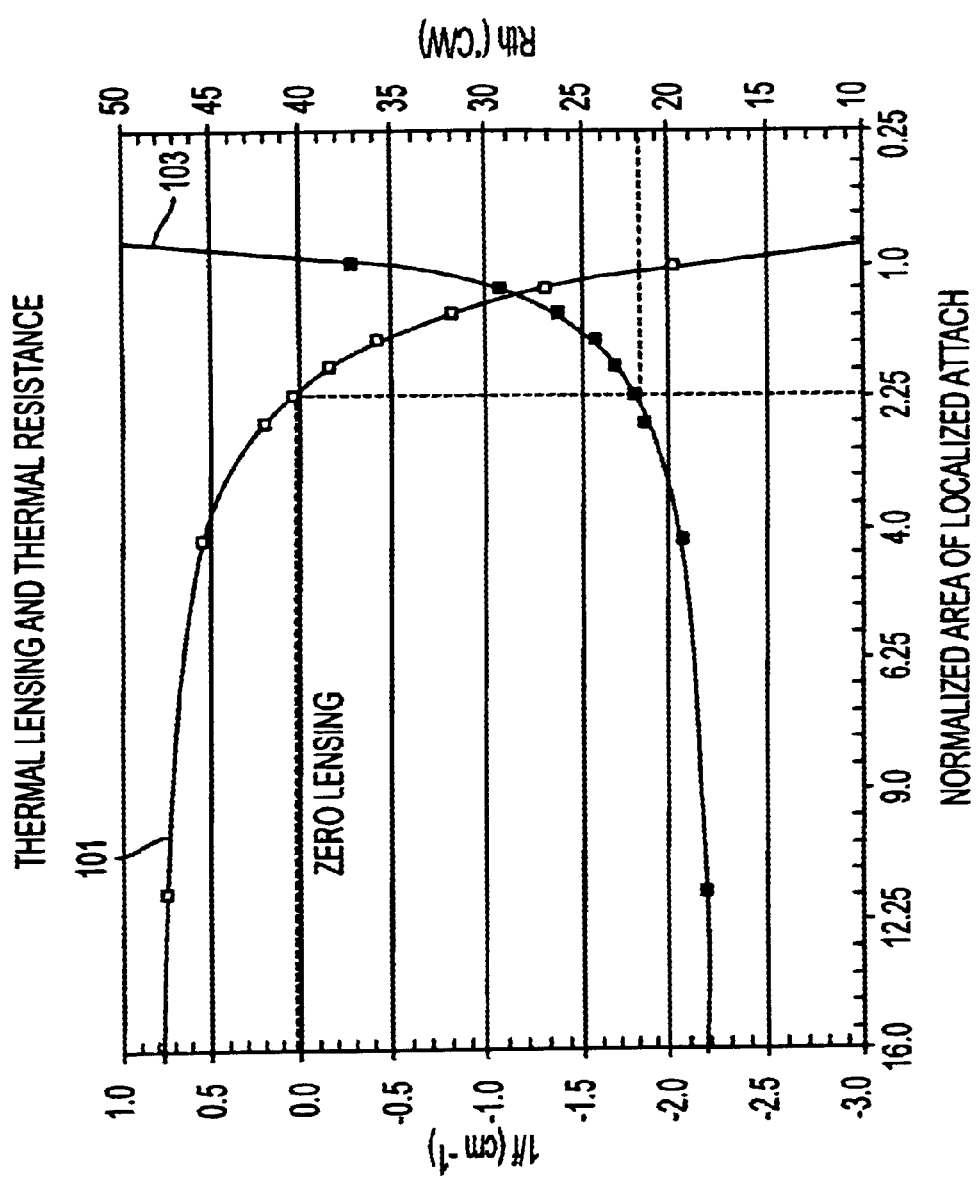
FIG. 7 is a graph showing a correlation between the thermal lensing effect and the size of the interface between the electrical contact of the optical device and the heat sink.

Referring to FIG. 7, a graph showing the relationship between the area of the heat sink interface and the area of the current aperture, for the same device as described with FIG. 6, is shown. In FIG. 7, the x-axis (which is not of a uniform scale) represents the ratio between the area of the heat sink interface and the area of the current aperture. Looking at FIG. 7, a reduction in thermal lensing is seen when the ratio is less than 9. At the other end of the spectrum, a thermal lensing reduction is seen when the ratio is greater than 1. It can be seen that a very low thermal lensing effect (i.e., less than approximately 0.5 cm$^{-1}$ focal length in magnitude) is seen in this example where the ratio is between approximately 1.5 and approximately 9.0 and the optimal point is when the ratio is at 2.5. As with the device described in FIG. 6, as the parameters of the optical device are changed, the ratio of the area of the current aperture and the heat sink interface are selected so as to control the resulting thermal lensing effect for the device.

Figure 8:
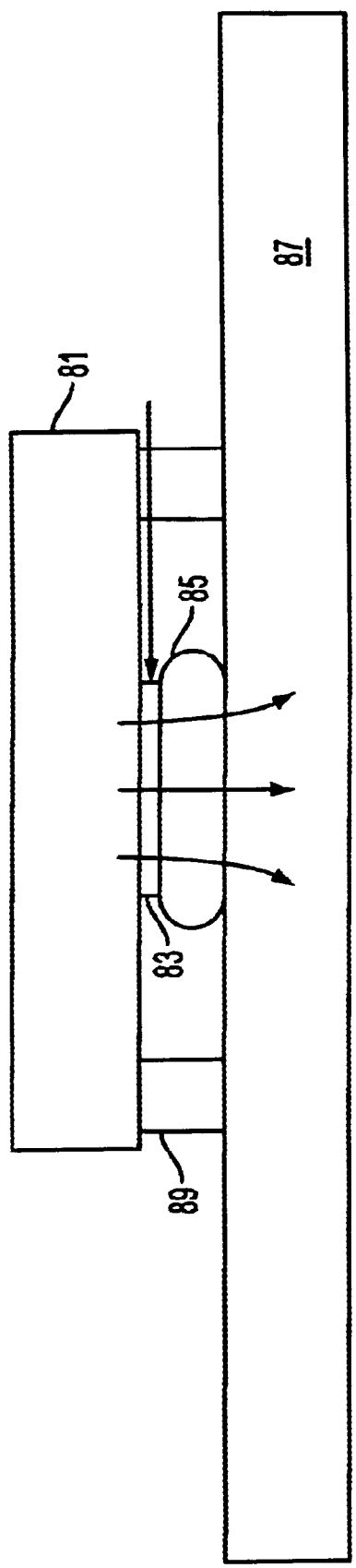
FIG. 8 is a diagram of an optical device attached to a heat sink according to another embodiment of the present invention.

Referring to FIG. 8, a diagram is shown presenting an embodiment for attaching an optical device to a heat sink. In this example, the optical device 81 includes an electrical contact that is thermally coupled to a heat sink 87 via a gold-tin solder 85. As shown by the arrows, heat is transferred from the device 81 through the contact 83 and solder 85 into the heat sink 87. In this example the ratio of the area of the contact to the area of the heat sink interface is 1. For balance and to prevent cracking of the solder 87, spacers 89 are provided to further support the device 81 on the substrate. The attachment of the optical device 101 to the heat sink can be done in any of a variety of ways. For example, once the device is completed, a photolithographic mask may be deposited on the side of the device that includes the electrical contact 83. The mask would be developed so as to expose the desired area of the device (in this example, only the electrical contact would be exposed. Then, solder is deposited on to the contact and the photolithographic mask is removed. The height of the spacers can be used to control the thickness of the insulating layer (e.g., air in this example). The device is then connected to the heat sink. In this example, the pressing of the device to the heat sink causes the solder to press out slightly. Thus, the amount of solder should be controlled to keep the area of the heat sink interface at the desired level.

Figure 9:
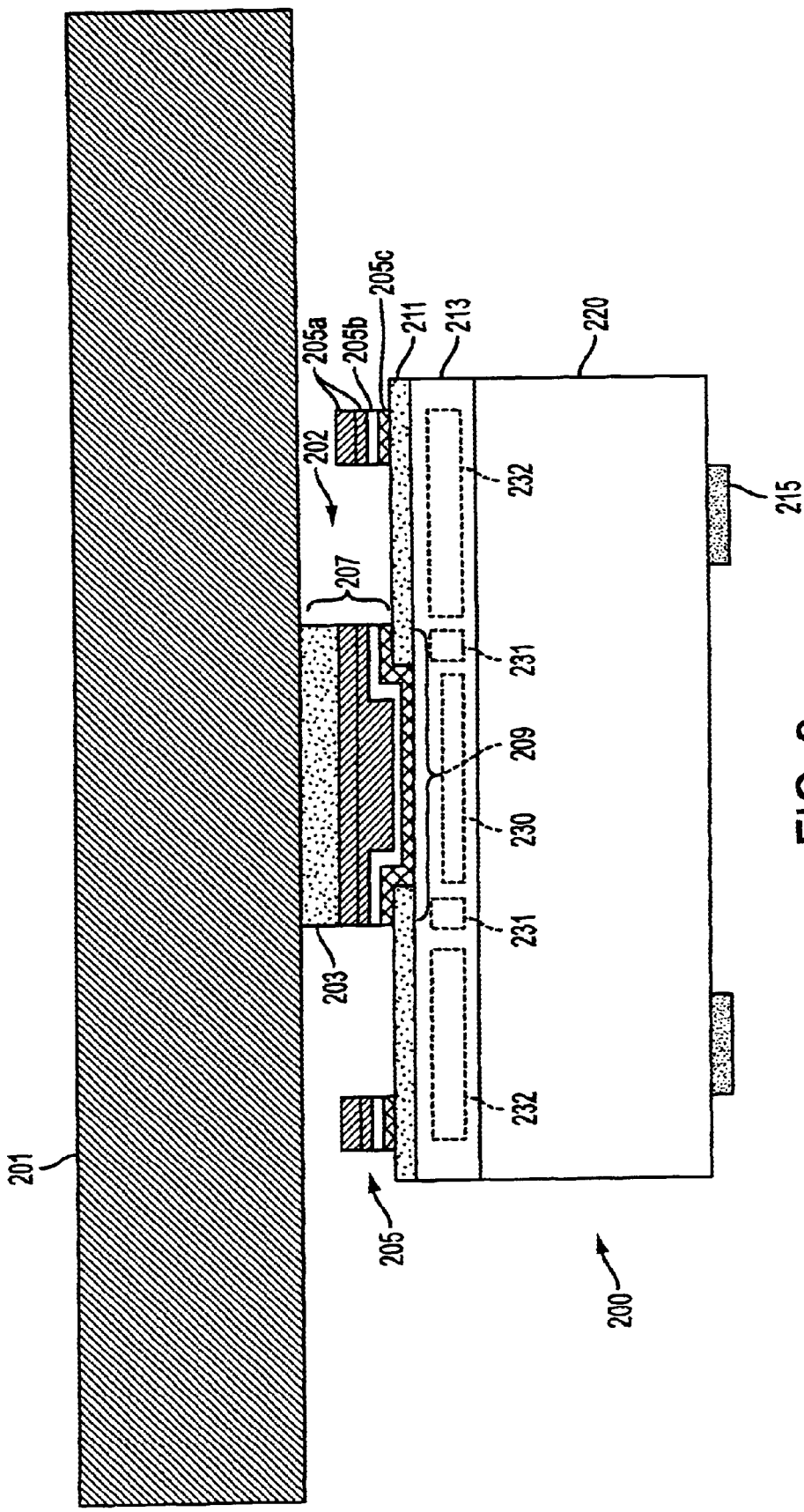
FIG. 9 is a diagram of an optical device attached to a heat sink according to another embodiment of the present invention.

Referring to FIG. 9, another embodiment of a device designed in accordance with the present invention is shown. In FIG. 9, a VCSEL device 200 is shown that includes, for example, a substrate 220, an active laser cavity 213 (including a gain region and mirrors), and a ring-like electrical contact 215. A layer of silicon nitride ($Si_3N_4$), 211 is deposited onto the device using a plasma enhanced chemical vapor deposition (PECVD). As known in the art, $Si_3N_4$ is electrically insulating and somewhat thermally insulating.

Using a standard photolithography process, the SiN layer 211 is etched so as to make a desired space for the electrical contact, or "current aperture" 209. In one embodiment, a "2-layer" or "thick resist" process is used to deposit the electrical contact 209 as well as support posts 205. In this process, a first phototresist layer is deposited over the device and blanket exposed. Then, a second layer of photoresist is deposited and exposed in the areas where the contact 209 and support posts 205 are to be deposited. The photoresist in these areas is etched away. Because the first layer was blanket exposed, it etches away faster creating a larger opening than in the first photoresist layer. A layer of titanium 205c, a layer of platinum 205b, and two layers of gold 205a are then deposited over the entire surface. The deposited photoresist is then removed, allowing any metal deposited on it to float away, leaving the electrical contact 209 and support posts 205. Alternatively, an "image reversal" process may be used where the photoresist is over developed to create a steep step in the photoresist.

A gold-tin solder 203 (for example, having 20% tin) is then deposited over the electrical contact 209 using another 2-layer or thick resist process. A "pick and place" process, such as one known in the art, is then used to pick up the laser die, place it on the heat sink 201, and the whole assembly is heated to the solder's melting point. The gold-tin solder 203 completes the heat sink interface 207 between the device 200 and the heat sink 201. In an alternative embodiment, the solder 203 is applied in a uniform layer across the whole surface of the heat sink 201, but makes contact with the optical device only in the area of the heat sink interface.

In this example, the support posts 205 do not contact the heat sink 201. During the wire bonding process where wires are bonded to the electrical contact 205, the posts 205 prevent the device from bending too much relative to the heat sink. In this example, the insulating region 202 contains air as the insulating material.

In this device, the principal region of heat generation 230 is aligned with the current aperture 209, with the heat radiated into the surrounding regions diminishing in a radial direction. Since this particular embodiment is designed to substantially eliminate thermal lensing within the device, the heat sink interface is tailored to withdraw heat from the regions in which it is present roughly in proportion to the amount of heat in those regions. Therefore, the heat sink interface directly contacts the device over the area of the current aperture with a material of very high heat conductivity. In the area 231 immediately surrounding the principal region of heat generation 230, where less heat is present, a portion of material of lower thermal conductivity (in this case $Si_3N_4$) between the heat sink interface and the device reduces the thermal conductivity of this portion of the heat sink interface (the portion in alignment with area 231). This region of reduced thermal conductivity is still, however, more thermally conductive than the insulating region (filled with air in this embodiment).

The insulating region is still somewhat thermally conductive, but since less heat is generated in the corresponding region in the device 232 (substantially aligned with the insulating region 202), the thermal conductivity of this area is greatly reduced to maintain even radial temperature distribution within the device. In this embodiment, the thermal conductivity of the insulating region 202 is selected so that sufficient heat flows from the region 232 aligned with the insulating region 202 to match the temperature profile of this region to the temperature profile of the regions aligned with the heat sink contact 230, 231.

In addition to achieving a desired temperature profile within the optical device, the embodiment of FIG. 9 provides other advantages as well. For example, the mechanical stresses in the device caused by coupling to the heat sink are reduced. When materials having different coefficients of thermal expansion are bonded via application of heat (e.g. soldering), the materials contract at different rates as they cool. This creates stresses between the materials and causes strain within the device. By decreasing the area of the heat sink interface (e.g., compared to the prior art, where the interface encompasses the entire surface of the optical device) and selecting a highly deformable insulating material (e.g., air as shown in FIG. 9) the strain in the final device can be greatly reduced. In the example shown in FIG. 9, low stress in the device is also maintained by not attaching the support posts 205 to the heat sink 201. In this way, the support posts 205 prevent the optical device 200 from deforming more than a certain amount in response to a force applied to the device, but they do not significantly add to the strain in the device.

Although embodiments are specifically illustrated and described herein, it is to be appreciated that modifications and variations of the present invention are covered by the above teachings and are within the purview of the appended claims, without departing from the spirit and intended scope of the invention. For example, though the first and second electrical contacts and heat sink interface are described as circles in the above embodiments, other shapes may be used, such as elliptical and square shapes. Square shapes may have better applicability in display devices such as computer monitors or television sets, for example. Also, though embodiments of the present invention are shown with respect to optical devices that are bottom-emitting VCSEL and VECSEL devices, the present invention is equally applicable to vertical cavity top-emitting devices, as well as other light-emitting devices such as edge-emitting semiconductor laser devices, solid state laser devices (e.g., solid-state microchip lasers), and light-emitting diodes.

In the case of top-emitting vertical cavity devices, the optical aperture would be on the opposite side of the device compared to, for example, the device shown in FIG. 1. In this case, the heat sink could be located on the opposite side of the substrate, and heat would be drawn through the substrate to the heat sink device. On the other hand, an optically-transparent heat sink could be located on the same side of the device as the optical aperture (i.e., closer to the gain region and the area of principal heat generation). In this case, the heat sink could be made of glass or sapphire ($Al_2O_3$), or other transparent material with good thermal conductivity. A transparent heat sink (and/or heat sink interface) material may also be employed for an optically pumped device where the pump beam is input from one side of the device and the laser beam is output from the opposite side. In some optically-pumped devices, however, the pump beam and output beam both travel through the same face of the laser, and the heat sink interface may be located on the opposite side of the device, with the heat sink comprised of a material that is not necessarily transparent.

What is claimed is:

1. An optical device comprising:

a substrate;

a light-emitting region coupled to the substrate;

a substantially circular current aperture through which current is injected to the light-emitting region;

a heat sink; and a heat sink interface between said heat sink and said current aperture, said heat sink interface having a substantially circular shape, such that a diameter of said heat sink interface is less than approximately 3 times the diameter of the current aperture.

2. The optical device of claim 1 further comprising:

an insulating region disposed between a portion of the substrate not overlapping the heat sink interface and a portion of the heat sink not overlapping the heat sink interface.

3. An optical device comprising:

a substrate;

a light-emitting region coupled to the substrate;

a substantially circular current aperture through which current is injected to the light-emitting region;

a heat sink; and a heat sink interface between said heat sink and said current aperture, said heat sink interface having an area, such that a ratio between the area of the heat sink interface and the area of the current aperture is less than approximately 10:1.

4. The optical device of claim 3 wherein said ratio is greater than 1.

5. The optical device of claim 4, wherein said ratio is between approximately 1.5 and 4.

6. The optical device of claim 5, wherein the ratio is approximately 2.5.

7. The optical device of claim 3 further comprising:

an insulating region disposed between a portion of the substrate not overlapping the heat sink interface and a portion of the heat sink not overlapping the heat sink interface.

8. The optical device of claim 7, wherein:

a thermal impedance of said insulating region allows sufficient heat flow from a region substantially aligned with said insulating region to substantially match a temperature profile of a region substantially aligned with the heat sink interface.

9. The optical device of claim 3 further comprising:

an external mirror displaced from said light-emitting region.

10. The optical device of claim 9 wherein:

the external mirror is displaced from said substrate.

11. The optical device of claim 10, wherein the external mirror includes a lens.

12. A method of fabricating an optical device including a light-emitting device and a heat sink comprising the steps of:

providing a current injection region having an area; and providing a heat sink interface between the light-emitting device and the heat sink, including:

selecting a ratio between an area of the heat sink interface and the area of the current injection region to control a temperature distribution profile in said light-emitting device.

13. The method of claim 12, wherein:

selecting a ratio between an area of the heat sink interface and the area of the current injection region to control a temperature distribution profile includes selecting the ratio to control an amount of thermal lensing in said light-emitting device.

14. The method of claim 12 further comprising:

providing an insulating region disposed between the light-emitting device and the heat sink.

15. The method of claim 14, the step of providing an insulating region further comprising:

selecting a thermal conductivity of an insulating material for the insulating region to control a temperature distribution profile in said light-emitting device.

16. An optical device comprising:

a light-emitting diode;

a heat sink coupled to a first portion of a first surface of the light-emitting diode; and an insulating region disposed between the heat sink and a second portion of the first surface of the light-emitting diode.

17. A method of fabricating an optical device including a light-emitting device comprising the steps of:

determining a baseline temperature gradient profile present during operation of the light-emitting device;

determining a desired temperature gradient profile for operation of the light-emitting device;

adapting a heat sink to contact a first portion of a first surface of the light-emitting device;

adapting an insulating region to contact a second portion of the first surface of the light-emitting device; wherein the heat sink, the insulating region, and the first and second portions of the light-emitting device surface are adapted to adjust a temperature gradient profile from the baseline profile toward the desired profile.

18. A method for reducing thermal lensing in a light-emitting device comprising the steps of:

determining a principal heat generation region present during operation of the light-emitting device;

adapting an area of a heat sink interface to substantially align with a current heat generator principal heat generation region of the light emitting device;

coupling a heat sink to the light-emitting device via the heat sink interface.

19. A reduced strain optical device comprising:

a light-emitting device including a substrate and a light-emitting region coupled to the substrate;

a heat sink;

a heat sink interface coupling a first surface of the light-emitting device to the heat sink; and a deformable region, wherein:

the heat sink interface contacts a first portion of the first surface of the light-emitting device; and the deformable region is disposed between the heat sink and a second portion of the first surface of the light-emitting device.

20. The reduced strain optical device of claim 19, wherein:

the deformable region is comprised of air.

21. A method for reducing strain in a light-emitting device attached to a heal sink comprising:

providing a heat sink interface contacting a first portion of a first surface of the light-emitting device;

providing a deformable region between a second portion of the first surface of the light-emitting device and the heat sink.

* * * * *

UNITED STATES PATENT AND TRADEMARK OFFICE
CERTIFICATE OF CORRECTION

PATENT NO. : 6,636,539 B2
DATED : October 21, 2003
INVENTOR(S) : Robert J. Martinsen It is certified that error appears in the above-identified patent and that said Letters Patent is hereby corrected as shown below:

Column 3,
Line 52, "insulting" should be -- insulating --

Column 8,
Line 8, "phototresist" should be -- photoresist --

Column 10,
Line 5, after "than" delete "approximately"

Column 12,
Line 2, "generator" should be -- generating --

Signed and Sealed this

Thirty-first Day of May, 2005

JON W. DUDAS
*Director of the United States Patent and Trademark Office*